(12) United States Patent
Lu et al.

(10) Patent No.: US 10,242,613 B2
(45) Date of Patent: Mar. 26, 2019

(54) METHOD FOR DRIVING A DISPLAY PANEL, DISPLAY PANEL, AND DISPLAY DEVICE

(71) Applicant: WUHAN TIANMA MICRO-ELECTRONICS CO.,LTD., Wuhan (CN)

(72) Inventors: Qing Lu, Wuhan (CN); Min Zeng, Wuhan (CN); Xiaomeng Ma, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 15/800,091

(22) Filed: Nov. 1, 2017

(65) Prior Publication Data

US 2018/0053464 A1 Feb. 22, 2018

(30) Foreign Application Priority Data

May 22, 2017 (CN) .......................... 2017 1 0364010

(51) Int. Cl.
  *G09G 3/20* (2006.01)
  *G09G 5/00* (2006.01)
  *H01L 27/12* (2006.01)

(52) U.S. Cl.
  CPC ............. *G09G 3/2092* (2013.01); *G09G 3/20* (2013.01); *G09G 3/2022* (2013.01); *G09G 5/003* (2013.01);
  (Continued)

(58) Field of Classification Search
  CPC ....... G09G 2300/0408; G09G 2300/08; G09G 2310/0243; G09G 2310/0283; G09G 2310/0286; G09G 2330/021; G09G 3/2022; G09G 3/2092; G09G 5/003; G09G 3/3622; G09G 3/20; G09G 2310/0267;
  (Continued)

(56) References Cited

U.S. PATENT DOCUMENTS

| 5,546,104 A * | 8/1996 | Kuga | .................... | G09G 3/2092 345/213 |
| 5,874,933 A * | 2/1999 | Hirai | .................... | G09G 3/3622 345/690 |

(Continued)

FOREIGN PATENT DOCUMENTS

CN 100397470 C 6/2008

*Primary Examiner* — Richard J Hong
(74) *Attorney, Agent, or Firm* — Kilpatrick Townsend & Stockton LLP

(57) ABSTRACT

A method for driving a display panel, a display panel, and a display device are provided, where in a first operating mode, a gate driver circuit is controlled for each image frame to output a scan signal to N rows of gate lines on the display panel sequentially in a preset scan direction to thereby display throughout a screen; and in a second operating mode, the gate driver circuit is controlled for each image frame to output a scan signal to m adjacent rows of gate lines on the display panel sequentially in the preset scan direction to thereby display only in an area corresponding to the m adjacent rows of gate lines without scanning the gate lines in an area in which no image may be displayed, so as to lower power consumption of the display panel operating in the second operating mode.

19 Claims, 15 Drawing Sheets

(52) U.S. Cl.
CPC ... *H01L 27/124* (2013.01); *G09G 2300/0408* (2013.01); *G09G 2300/08* (2013.01); *G09G 2310/0243* (2013.01); *G09G 2310/0267* (2013.01); *G09G 2310/0283* (2013.01); *G09G 2310/0286* (2013.01); *G09G 2310/04* (2013.01); *G09G 2330/021* (2013.01)

(58) Field of Classification Search
CPC .............. G09G 2310/04; H01L 27/124; H03K 19/01742; G06F 3/147
See application file for complete search history.

(56) References Cited

U.S. PATENT DOCUMENTS

| | | | |
|---|---|---|---|
| 2004/0066381 A1* | 4/2004 | Lin | G06F 3/147 345/204 |
| 2008/0316192 A1* | 12/2008 | Akimoto | G06F 3/147 345/204 |
| 2018/0167070 A1* | 6/2018 | Kim | H03K 19/01742 |

* cited by examiner

METHOD FOR DRIVING A DISPLAY PANEL, DISPLAY PANEL, AND DISPLAY DEVICE

CROSS REFERENCE TO RELATED APPLICATION

This application claims priority of Chinese Patent Application No. 201710364010.7, filed with the Chinese Patent Office on May 22, 2017. The entire disclosure of the above application is incorporated herein by reference.

FIELD

The present invention relates to the field of display technologies, and particularly to a method for driving a display panel, a display panel, and a display device.

BACKGROUND

A gate driver circuit in a display in operation needs to be controlled to scan the from first row to the last row of a screen sequentially, but in a real application, typically only some picture, e.g., a clock, the amount of charges in a battery, etc., needs to be displayed in a part of the area on the screen in some operating mode, e.g., a standby or charging mode, so if the existing display still has the first row to the last row of the screen scanned sequentially in these operating modes, then power may be consumed unnecessarily.

SUMMARY

Embodiments of the invention provide a method for driving a display panel, a display panel, and a display device so as to lower the power consumption of the display panel, e.g., in a standby or charging mode.

An embodiment of the invention provides a display panel including a gate driver circuit, a timing controller, a mode switching circuit, and N rows of gate lines, and N is the total number of rows of gate lines on the display panel; the gate driver circuit is connected with the N rows of gate lines, and configured to be controlled by the timing controller to output a scan signal to the gate line; the mode switching circuit is configured to transmit a first mode control signal to the timing controller in a first operating mode, and a second mode control signal to the timing controller in a second operating mode; and the timing controller is configured to control the gate driver circuit for each image frame to output a scan signal to the N rows of gate lines on the display panel sequentially in a preset scan direction upon reception of the first mode control signal; and to control the gate driver circuit for each image frame to output a scan signal to m adjacent rows of gate lines on the display panel sequentially in the preset scan direction upon reception of the second mode control signal, and m is a predetermined integer greater than 0 and less than N.

Correspondingly an embodiment of the invention further provides a display device including the display panel according to the embodiment of the invention.

Correspondingly an embodiment of the invention further provides a method for driving a display panel, the method including: performing a first operating mode in which a gate driver circuit is controlled for each image frame to output a scan signal to N rows of gate lines on the display panel sequentially in a preset scan direction, and N is the total number of rows of gate lines on the display panel; and performing a second operating mode in which the gate driver circuit is controlled for each image frame to output a scan signal to m adjacent rows of gate lines on the display panel sequentially in the preset scan direction, and m is a predetermined integer greater than 0 and less than N.

Advantageous effects of the invention are as follows.

In the method for driving a display panel, the display panel, and the display device above according to the embodiments of the invention, in the first operating mode, the gate driver circuit is controlled for each image frame to output a scan signal to N rows of gate lines on the display panel sequentially in the preset scan direction to thereby display throughout the screen; and in the second operating mode, the gate driver circuit is controlled for each image frame to output a scan signal to m adjacent rows of gate lines on the display panel sequentially in the preset scan direction to thereby display only in an area corresponding to the m adjacent rows of gate lines without scanning the gate lines in an area in which no image may be displayed, i.e., the other gate lines than the m adjacent rows of gate lines, so as to lower power consumption of the display panel operating in the second operating mode.

DETAILED DESCRIPTION OF THE EMBODIMENTS

Figure 1:
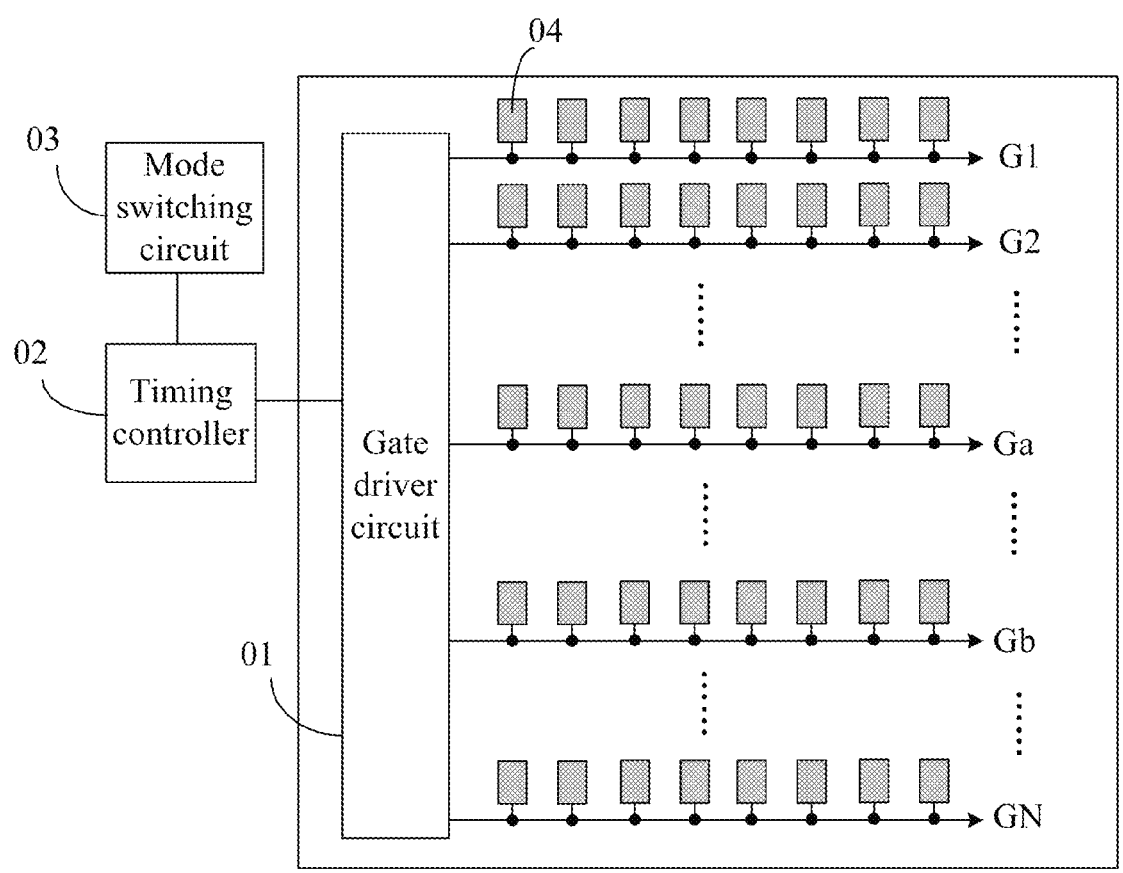
FIG. 1 is a schematic structural diagram of a display panel according to an embodiment of the invention.

In order to make the objects, technical solutions, and advantages of the invention more apparent, the invention may be described below in further details with reference to the drawings, and apparently the embodiments to be described below are only a part but not all of the embodiments of the invention. Based upon the embodiments here of the invention, all the other embodiments which can occur to those ordinarily skilled in the art without any inventive effort shall fall into the scope of the invention as claimed.

The shapes and sizes of respective components in the drawings are not intended to reflect their real proportions, but only intended to illustrate the disclosure of the invention.

A display panel according to an embodiment of the invention as illustrated in FIG. 1 includes a gate driver circuit 01, a timing controller 02, a mode switching circuit 03, and N rows of gate lines G1 to GN, where N is the total number of rows of gate lines on the display panel.

The gate driver circuit 01 is connected with the N rows of gate lines G1 to GN, and configured to output a scan signal to the gate lines G1 to GN to control pixel elements 04 to be enabled.

The mode switching circuit 03 is configured to transmit a first mode control signal to the timing controller 02 in the first operating mode, and a second mode control signal to the timing controller 02 in the second operating mode.

Figure 2A:
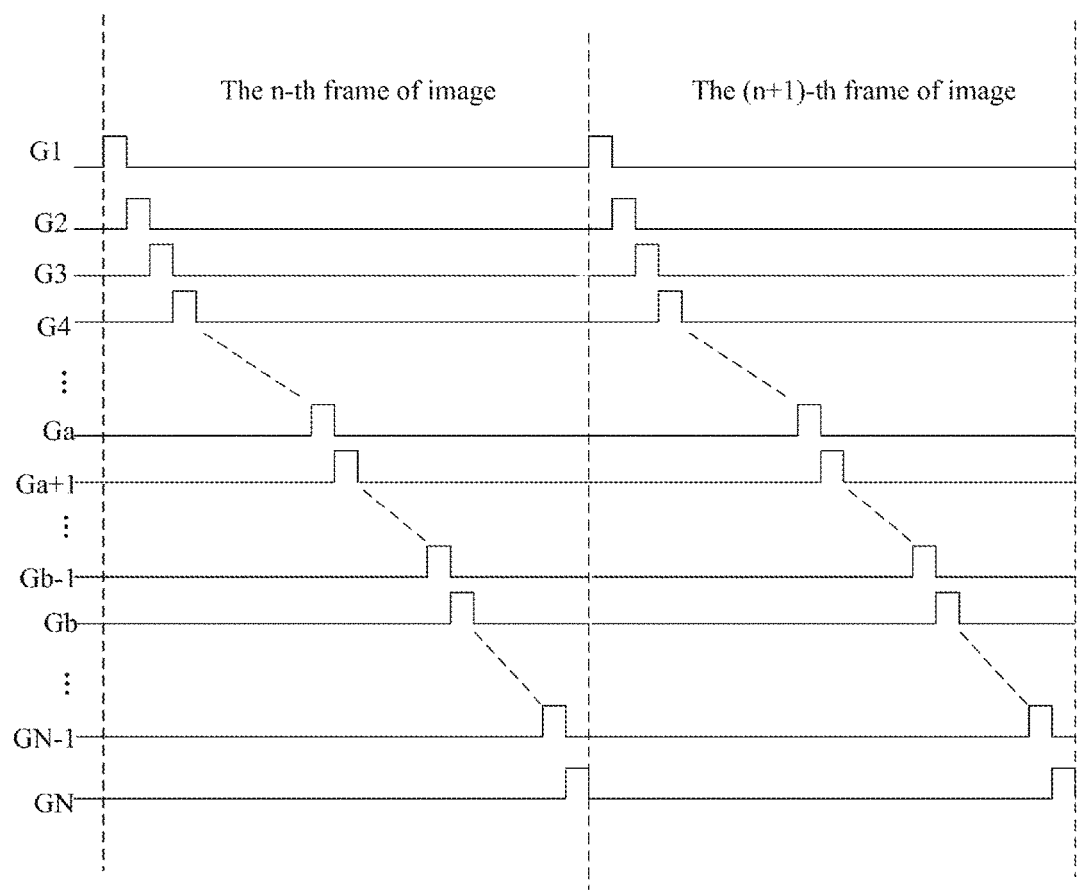
FIG. 2A is a timing diagram of a display panel in a first operating mode according to an embodiment of the invention.
Figure 2B:
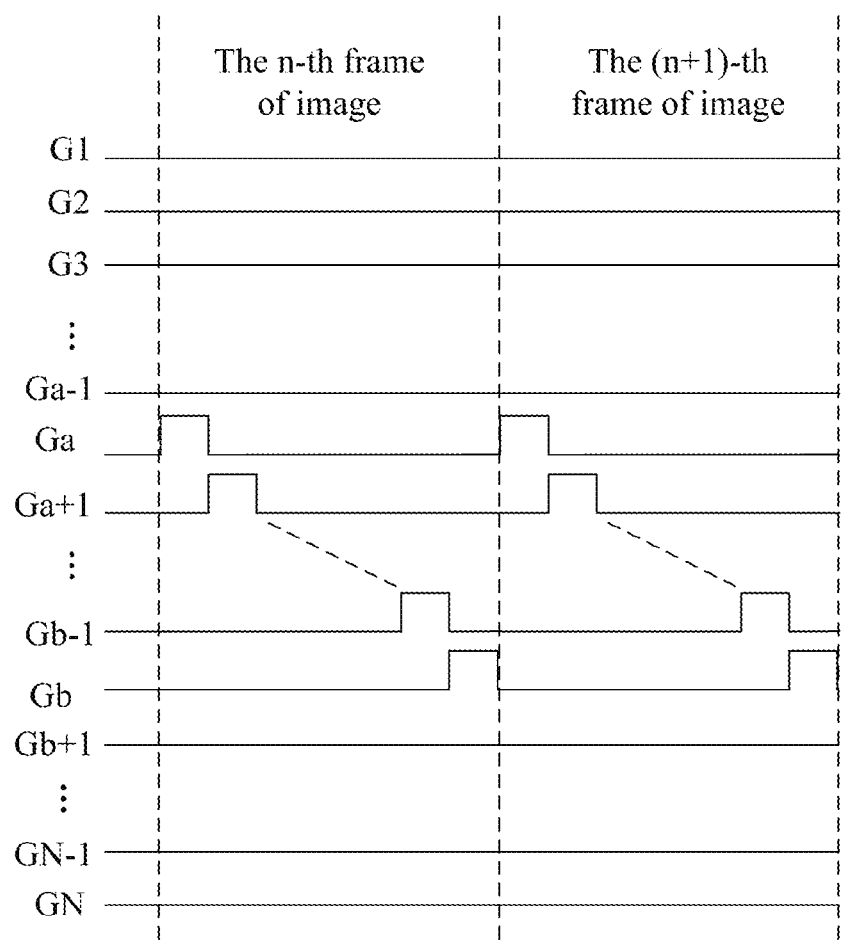
FIG. 2B is a timing diagram of a display panel in a second operating mode according to an embodiment of the invention.

The timing controller 02 is configured: to control the gate driver circuit 01 for each image frame to output a scan signal to the N rows of gate lines G1 to GN on the display panel sequentially in a preset scan direction, upon reception of the first mode control signal, where FIG. 2A illustrates a timing diagram of the N rows of gate lines G1 to GN; and to control the gate driver circuit 01 for each image frame to output a scan signal to m adjacent rows of gate lines, e.g., the a-th to b-th rows of gate lines Ga to Gb, on the display panel sequentially in the preset scan direction, upon reception of the second mode control signal, where FIG. 2B illustrates a timing diagram of the N rows of gate lines G1 to GN, where m is a predetermined integer greater than 0 and less than N, and b=a+m−1.

In the display panel according to the embodiment of the invention, the mode switching circuit transmits the first mode control signal to the timing controller in the first operating mode, and the second mode control signal to the timing controller in the second operating mode; and the timing controller controls the gate driver circuit for each image frame to output a scan signal to the N rows of gate lines G1 to GN on the display panel sequentially in the preset scan direction upon reception of the first mode control signal to thereby display throughout the screen. The timing controller controls the gate driver circuit for each image frame to output a scan signal to m adjacent rows of gate lines on the display panel sequentially in the preset scan direction upon reception of the second mode control signal to thereby display only in an area corresponding to the m adjacent rows of gate lines without scanning the gate lines in an area in which no image may be displayed, i.e., the other gate lines than the m adjacent rows of gate lines, so as to lower power consumption of the display panel operating in the second operating mode.

In one implementation, the first operating mode refers to a full-screen display mode of the display panel, e.g., a normal display mode, and the second operating mode refers to a display mode on a part of an area on the display panel, e.g., a standby or charging mode, where an image only needs to be displayed in the part of the area on the display panel, for example, a clock, the remaining amount of charges, or another indicating pattern needs to be displayed.

In one implementation, the mode switching circuit can be a Field Programmable Gate Array (FPGA), a Complex Programmable Logic Device (CPLD), an Acorn RISC Machine (ARM) processor, a Programmable Logic Controller (PLC), etc., although the embodiment of the invention may not be limited thereto.

It should be noted that in one implementation, m is preset as required by a user, for example, as specified for an existing display panel, if it operates in the second mode, then it may display only in an upper part of the area on the screen, e.g., an area corresponding to the first to $100^{th}$ gate lines, so the m adjacent rows of gate lines may be set to the first to $100^{th}$ gate lines; and for example, as specified for some display panel, if it operates in the second mode, then it may display at the middle of the area on the screen, e.g., an area corresponding to the $1000^{th}$ to $1050^{th}$ gate lines, so the m adjacent rows of gate lines may be set to the $1000^{th}$ to $1050^{th}$ gate lines. These examples are only illustrative, but the embodiment of the invention may not be limited thereto.

In one implementation, the preset scan direction may be a forward or backward scan direction but the embodiment of the invention may not be limited thereto, where the forward scan direction refers to a scan direction from the top of the display panel to the bottom thereof, and the backward scan direction refers to a scan direction from the bottom of the display panel to the top thereof. All the embodiments here of the invention may be illustrated taking the forward scan direction as an example.

It should be noted that in the embodiment of the invention, the scan signal refers to a signal to switch on a Thin Film Transistor (TFT) in a pixel element connected on a gate line, where the potential of the scan signal is at a high potential for an N-type TFT, and at a low potential for a P-type TFT.

For the sake of a convenient description, all the embodiments here of the invention may be described by way of an example in which the scan signal is at a high potential, but the same principle as the scan signal at a high potential may apply to the scan signal at a low potential, so a repeated description thereof may be omitted here.

Figure 3A:
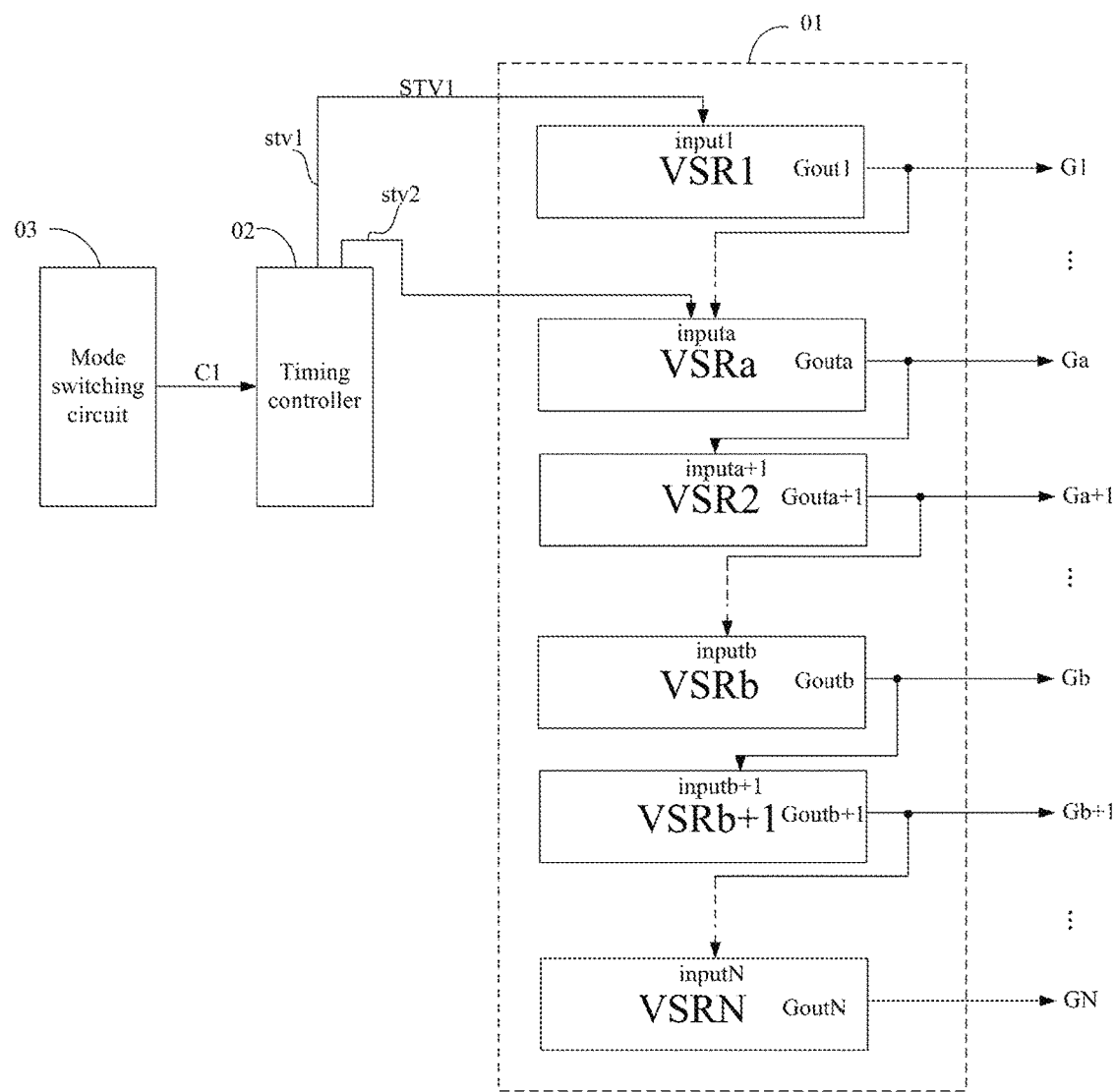
FIG. 3A illustrates signals being transmitted between circuits of a display panel in a first operating mode according to an embodiment of the invention.
Figure 3B:
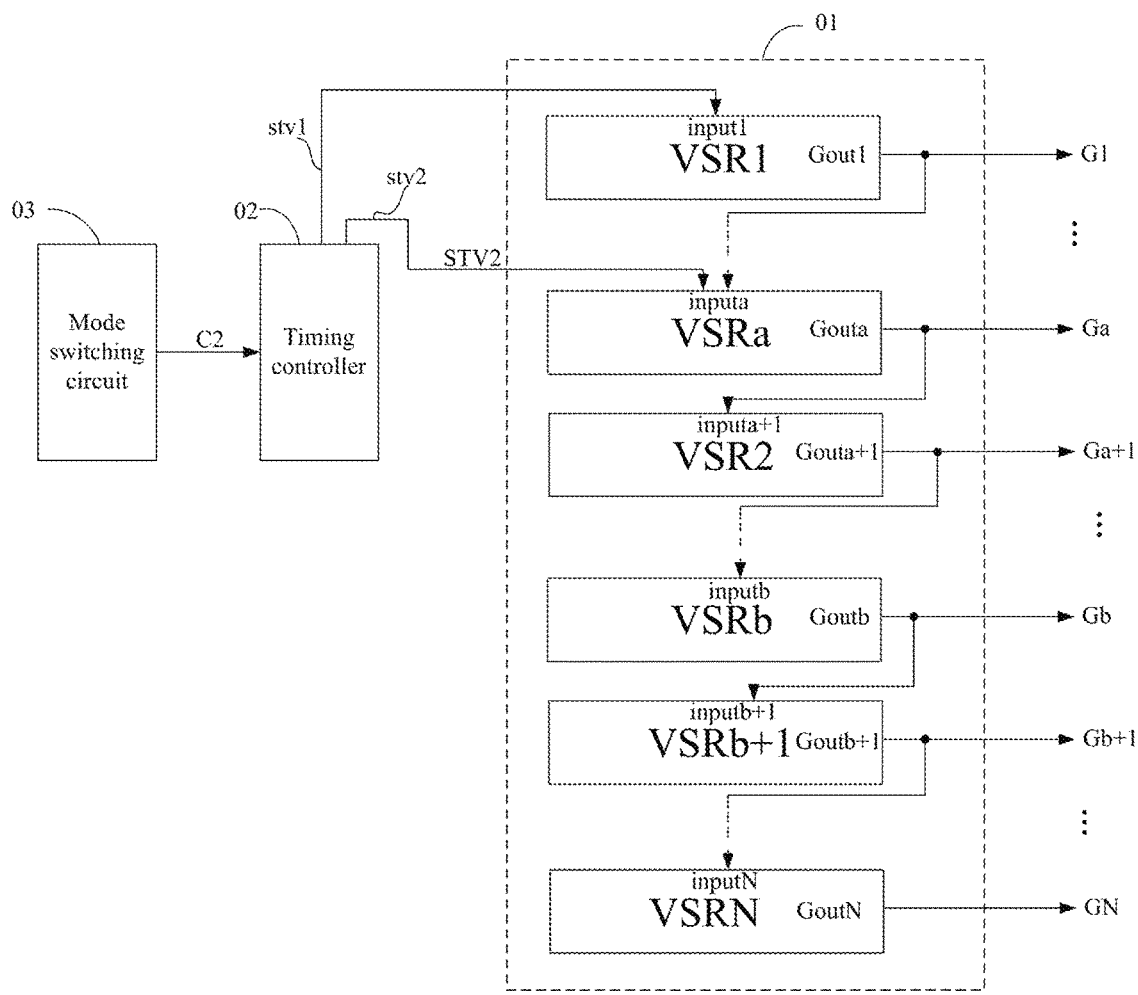
FIG. 3B illustrates signals being transmitted between circuits of a display panel in a second operating mode according to an embodiment of the invention.

In one implementation, in the display panel according to the embodiment of the invention, as illustrated in FIG. 3A and FIG. 3B, the gate driver circuit 01 includes N levels of shift registers VSR1 to VSRN, which are concatenated, where each level of shift register VSRn corresponds to one row of gate lines Gn on the display panel, and the a-th level of shift register VSRa to the b-th level of shift register VSRb correspond to m adjacent rows of gate lines Ga to Gb on the display panel.

As illustrated in FIG. 3A, the timing controller 02 is configured to transmit a frame trigger signal, i.e., a first trigger signal STV1, to the first level of shift register VSR1 of the gate driver circuit 01 to trigger the N levels of shift registers VSR1 to VSRN to output a scan signal sequentially for each image frame a frame, upon reception of the first mode control signal C1.

As illustrated in FIG. 3B, the timing controller 02 is configured to transmit a frame trigger signal, i.e., a second trigger signal STV2, to the a-th level of shift register VSRa of the gate driver circuit 01 to trigger the a-th level of shift register VSRa to the b-th level of shift register VSRb to output a scan signal sequentially for each image frame a frame, upon reception of the second mode control signal C2.

In the display panel according to the embodiment of the invention, the trigger signals are transmitted to the different levels of shift registers in the same gate driver circuit in the different operating modes to control a scan range in the gate driver circuit, that is, the operating mode can be switched using the same gate driver circuit to thereby facilitate a design of the display panel with a narrow frame edge.

In one implementation, in the display panel according to the embodiment of the invention, when the timing controller transmits the frame trigger signal to the first level of shift register, it does not transmit any frame trigger signal to the a-th level of shift register; and when the timing controller transmits the frame trigger signal to the a-th level of shift register, it does not transmit any frame trigger signal to the first level of shift register.

In one implementation, in the display panel according to the embodiment of the invention, as illustrated in FIG. 3A and FIG. 3B, the timing controller 02 transmits the frame trigger signal, i.e., the first trigger signal STV1, to the first level of shift register VSR1 over a first trigger signal line stv1 connected between the first level of shift register VSR1 and the timing controller 02.

The timing controller 02 transmits the frame trigger signal, i.e., the second trigger signal STV2, to the a-th level of shift register VSRa over a second trigger signal line stv2 connected between the a-th level of shift register VSRa and the timing controller 02. That is, the second trigger signal line stv2 connected between the timing controller 02 and the a-th level of shift register VSRa is added to the existing display frame.

Figure 4:
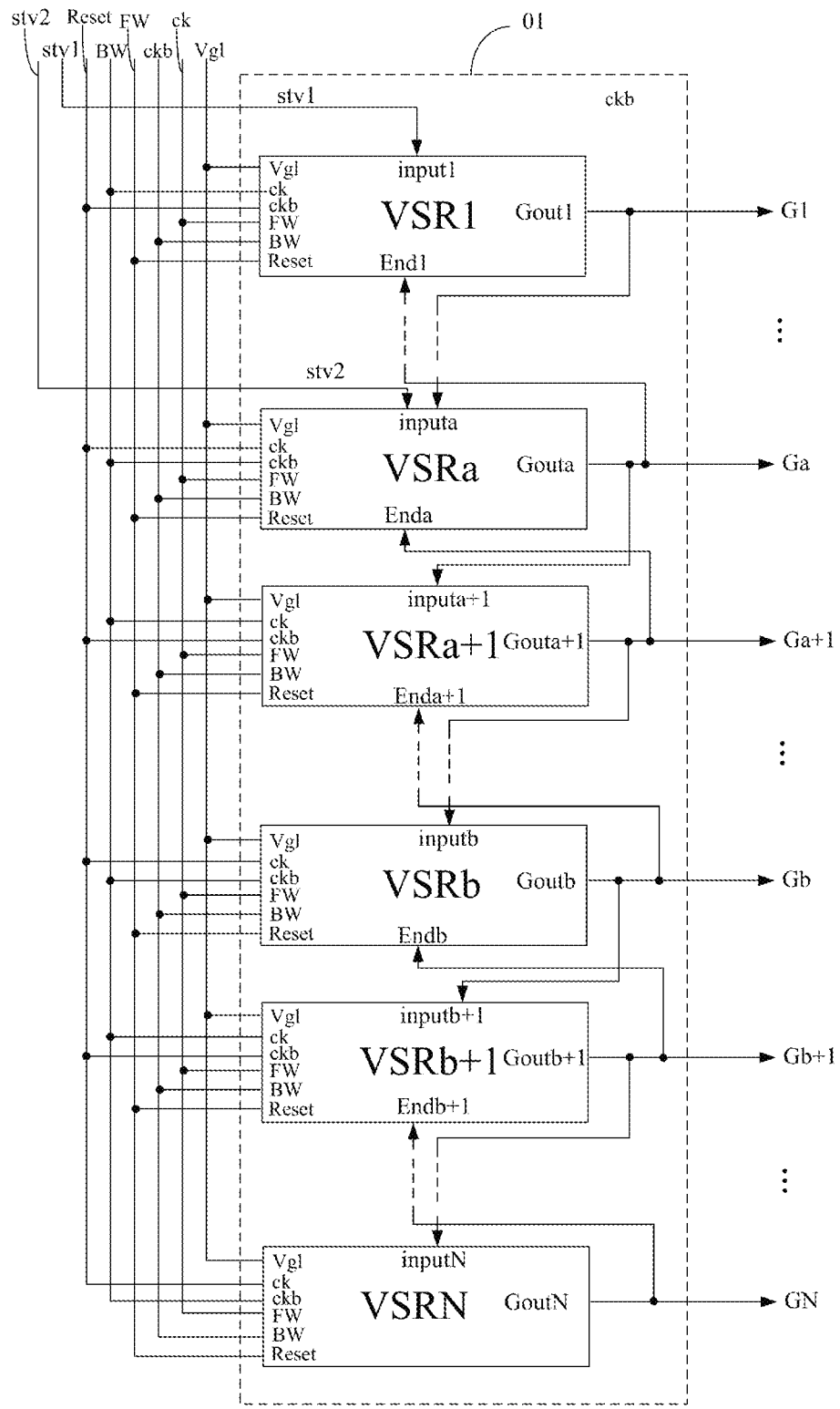
FIG. 4 is a schematic structural diagram of a gate driver circuit in a display panel according to an embodiment of the invention.

In one implementation, in the display panel according to the embodiment of the invention, as illustrated in FIG. 4, in the gate driver circuit 01, an output terminal Goutn of each level of shift register VSRn other than the first level of shift register VSR1 is connected with an end terminal Endn−1 of a preceding level of shift register VSRn−1; the output terminal Goutn of each level of shift register VSRn other than the last level of shift register VSRN is connected with an input terminal inputn+1 of a succeeding level of shift register VSRn+1; and a reset terminal Reset of each level of shift register is connected with the same reset signal line.

In one implementation, in the gate driver circuit according to the embodiment of the invention, the last level of shift register can be connected with the first trigger signal line, and disabled using a trigger signal of a next frame. Of course, the last level of shift register can alternatively be connected separately with and disabled by a disable signal terminal, although the embodiment of the invention may not be limited thereto.

In one implementation, in the gate driver circuit, as illustrated in FIG. 4, each level of shift register VSRn further receives clock signals ck and ckb, a low-level signal Vg1, etc., although the embodiment of the invention may not be limited thereto.

Furthermore in one implementation, in the gate driver circuit capable of bidirectional scanning, as illustrated in FIG. 4, each level of shift register VSRn receives a forward scan signal FW and a negative scan signal BW.

Figure 5:
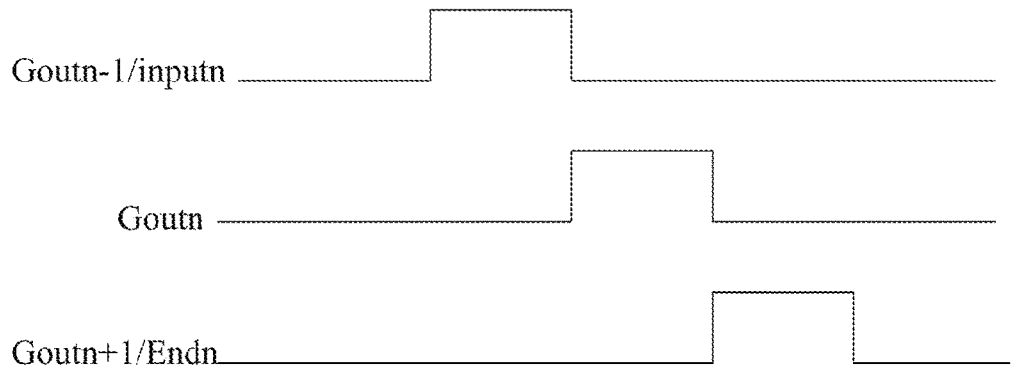
FIG. 5 is a timing diagram of the n-th level of shift register in a gate driver circuit in a display panel according to an embodiment of the invention.

In an operating principle of the gate driver circuit, as illustrated in FIG. 5, if the input terminal inputn of the n-th level of shift register VSRn receives a scan signal output by the output terminal Goutn−1 of the (n−1)-th level of shift register, the n-th level of shift register VSRn may be triggered, if the scan signal output by the output terminal Goutn−1 of the (n−1)-th level of shift register VSRn−1 ends, then the n-th level of shift register VSRn may start to output a high level, i.e., a scan signal, and if the end terminal Endn of the n-th level of shift register VSRn receives a scan signal output by the output terminal Goutn+1 of the (n+1)-level of shift register, then the scan signal output by the output terminal Goutn−1 of the n-th level of shift register VSRn may end, that is, the potential may become low. If the reset terminal Reset of the n-th level of shift register VSRn receives a reset signal, then the n-th level of shift register VSRn may be reset, that is, the potential of the output terminal Goutn may become low. In the existing display panel, the reset signal is typically transmitted before the trigger signal primarily for the purpose of clearing data in the respective levels of shift registers so that low-level signals are output at the output terminals of the respective levels of shift registers.

Figure 6:
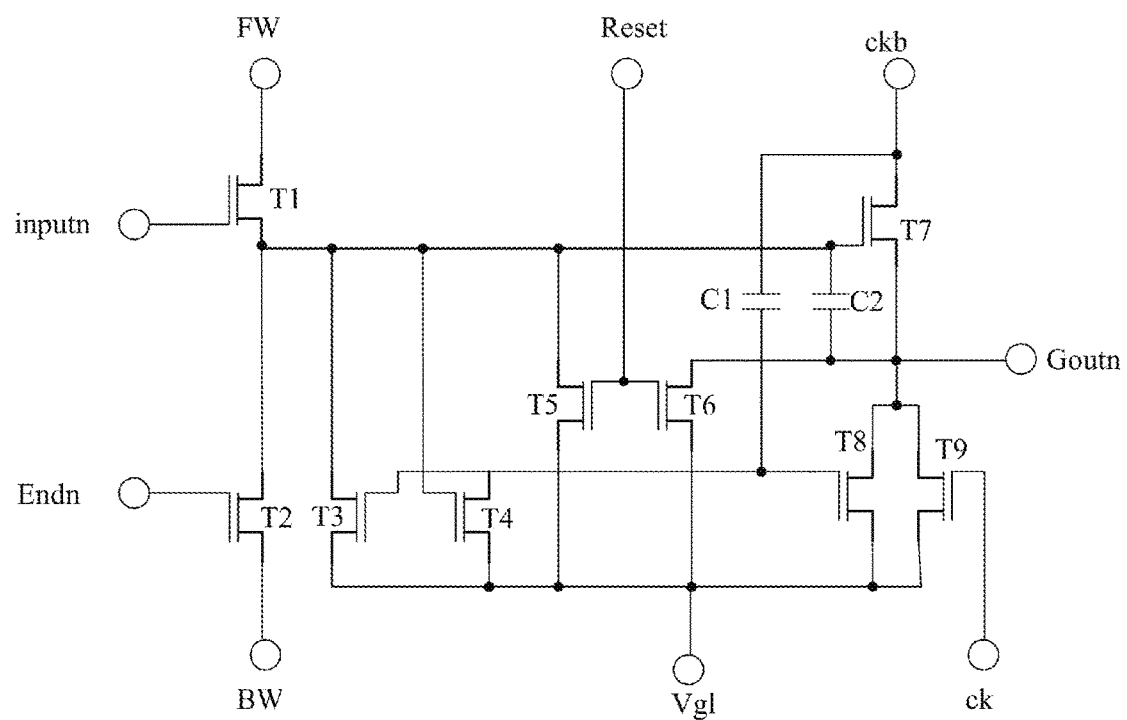
FIG. 6 is a schematic structural diagram of a shift register in a display panel according to an embodiment of the invention.

In one implementation FIG. 6 illustrates a schematic structural diagram of a shift register in the gate driver circuit, where the shift register includes nine thin film transistors T1 to T9, and two capacitors C1 and C2. It should be noted that FIG. 6 only illustrates one of existing structures of the shift register, and a particular operating principle thereof may not be described here in details. In an embodiment of the invention, the structure of the shift register may not be limited thereto, but may be any structures in which the gate driver circuit can function as described above, although they may not be enumerated here.

In the display panel according to the embodiment of the invention, in the second operating mode, in order to trigger only the a-th level of shift register to the b-th level of shift register to output a scan signal sequentially, in order to avoid the (b+1)-th level of shift register from outputting a scan signal after the b-th level of shift register outputs a scan signal, a reset signal may be output to the (b+1)-th level of shift register, or a clock signal may be converted into a direct-current signal, although the embodiment of the invention may not be limited thereto. In this way, the (b+1)-th level of shift register can be structured the same as the shift register in the existing gate driver circuit without necessary of structurally modifying the (b+1)-th level of shift register.

Accordingly in one implementation, in the display panel according to the embodiment of the invention, the timing controller is further configured to transmit a reset signal to the (b+1)-th level of shift register after the frame trigger signal is transmitted to the a-th level of shift register, and the b-th level of shift register outputs the scan signal.

Figure 7:
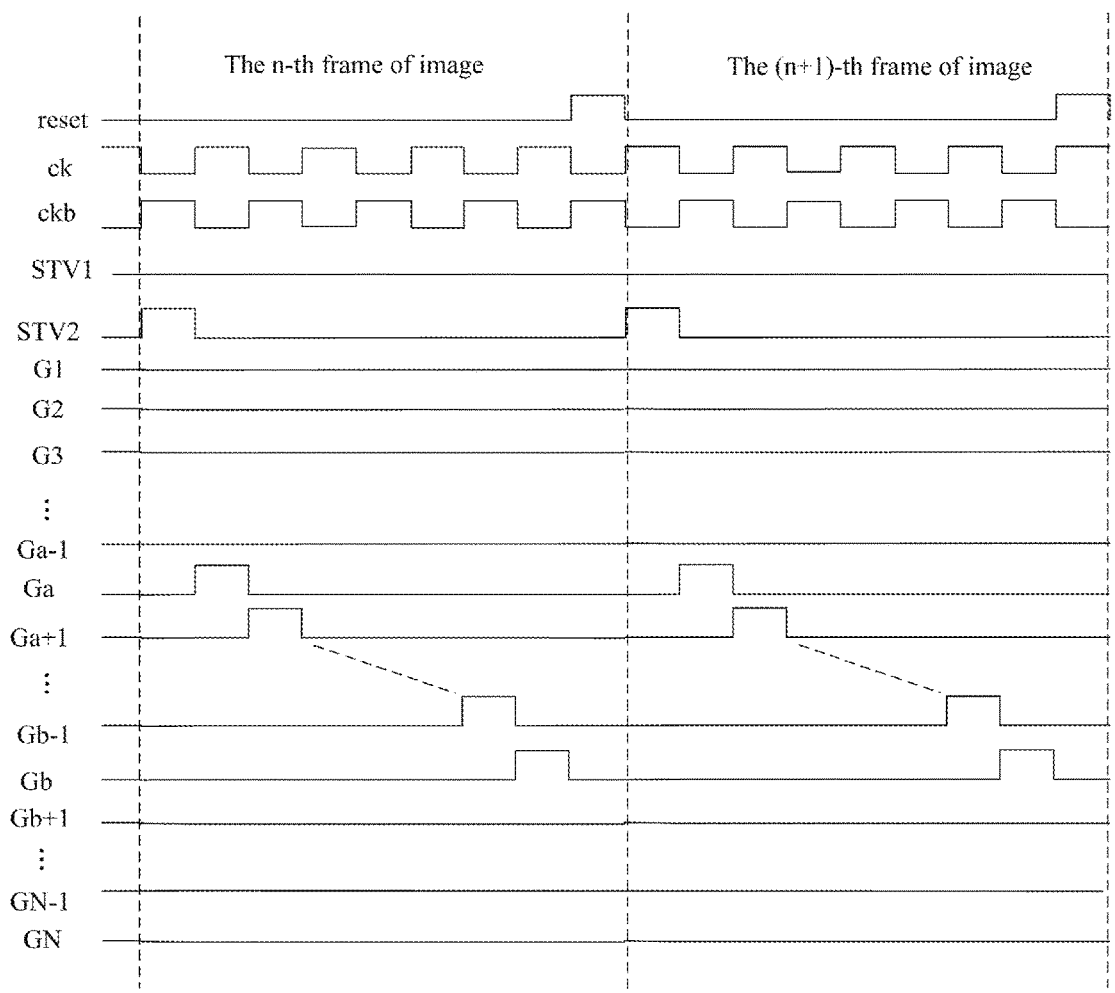
FIG. 7 is a timing diagram of a gate driver circuit of a display panel in a second operating mode according to an embodiment of the invention.

In one implementation, in the display panel according to the embodiment of the invention, the timing controller is further configured to transmit a reset signal to the other levels of shift registers at the same time when it transmits the reset signal to the (b+1)-th level of shift register. Since the reset terminal of each level of shift register in the existing gate driver circuit is connected with the same reset signal line, in order to transmit the reset signal to the (b+1)-th level of shift register without changing the connection relationship in the gate driver circuit, the reset signal may be transmitted to each level of shift register. In one embodiment, FIG. 7 illustrates a timing diagram of the gate driver circuit, where Reset represents a reset signal received by the gate driver circuit.

Figure 8:
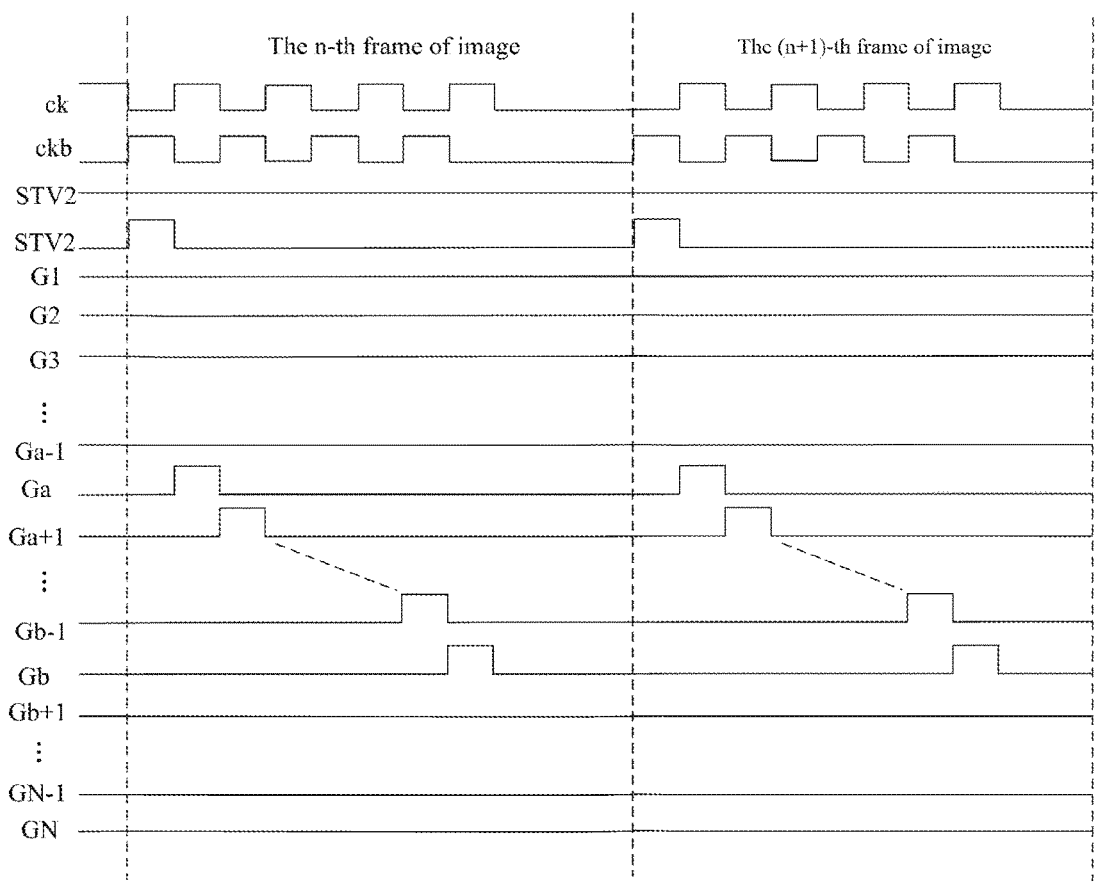
FIG. 8 is another timing diagram of a gate driver circuit of a display panel in a second operating mode according to an embodiment of the invention.

Alternatively in the display panel according to the embodiment of the invention, the timing controller is further configured to convert a clock signal transmitted to the gate driver circuit into a direct-current signal after the frame trigger signal is transmitted to the a-th level of shift register, and the b-th level of shift register outputs a scan signal, where only the clock signal is converted into a direct-current signal without changing the connection relationship in the gate driver circuit. In one embodiment, FIG. 8 illustrates a timing diagram of the gate driver circuit.

In one implementation, in the display panel according to the embodiment of the invention, the timing controller is further configured to transmit a reset signal to the respective levels of shift registers after the first mode control signal or the second mode control signal is received, and before the frame trigger signal is output to the gate driver circuit for each image frame. That is, before each image frame is scanned, data in the gate driver circuit are firstly cleared, that is, charges remaining in the gate driver circuit for a previous image frame are cleared. In one embodiment, FIG. 9A and FIG. 9B illustrate timing diagrams of the gate driver circuit, where Reset represents a reset signal received by a gate driver circuit.

Figure 9A:
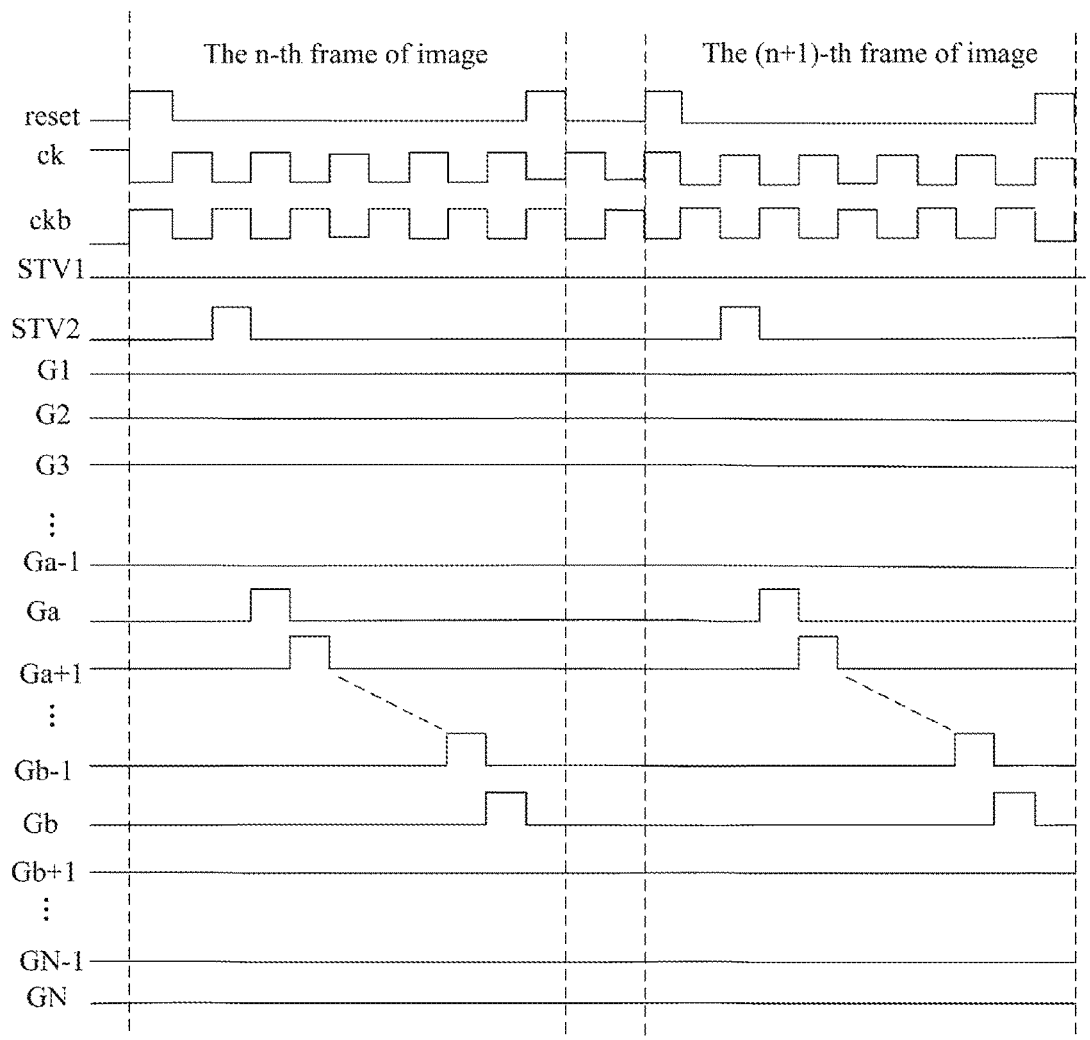
FIG. 9A is a further timing diagram of a gate driver circuit of a display panel in a second operating mode according to an embodiment of the invention.
Figure 9B:
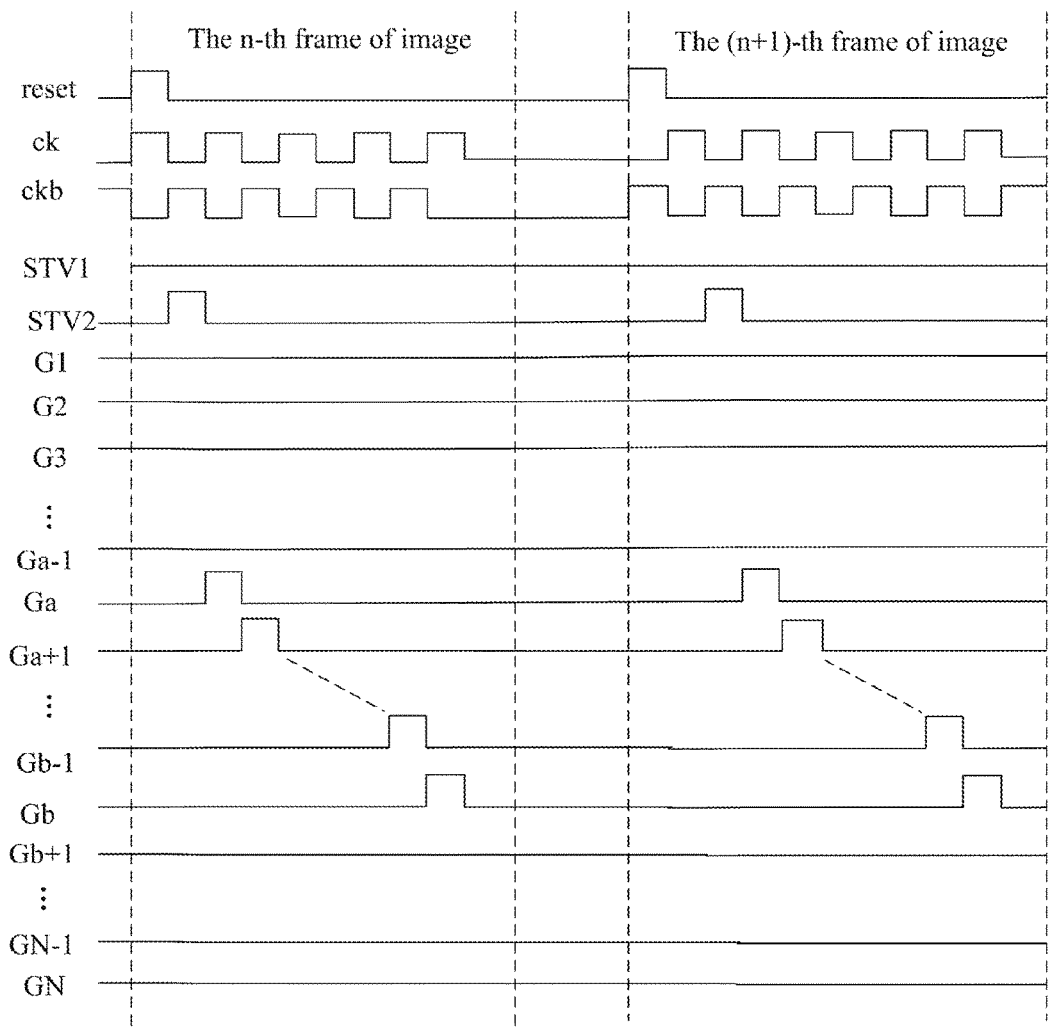
FIG. 9B is a further timing diagram of a gate driver circuit of a display panel in a second operating mode according to an embodiment of the invention.
Figure 9C:
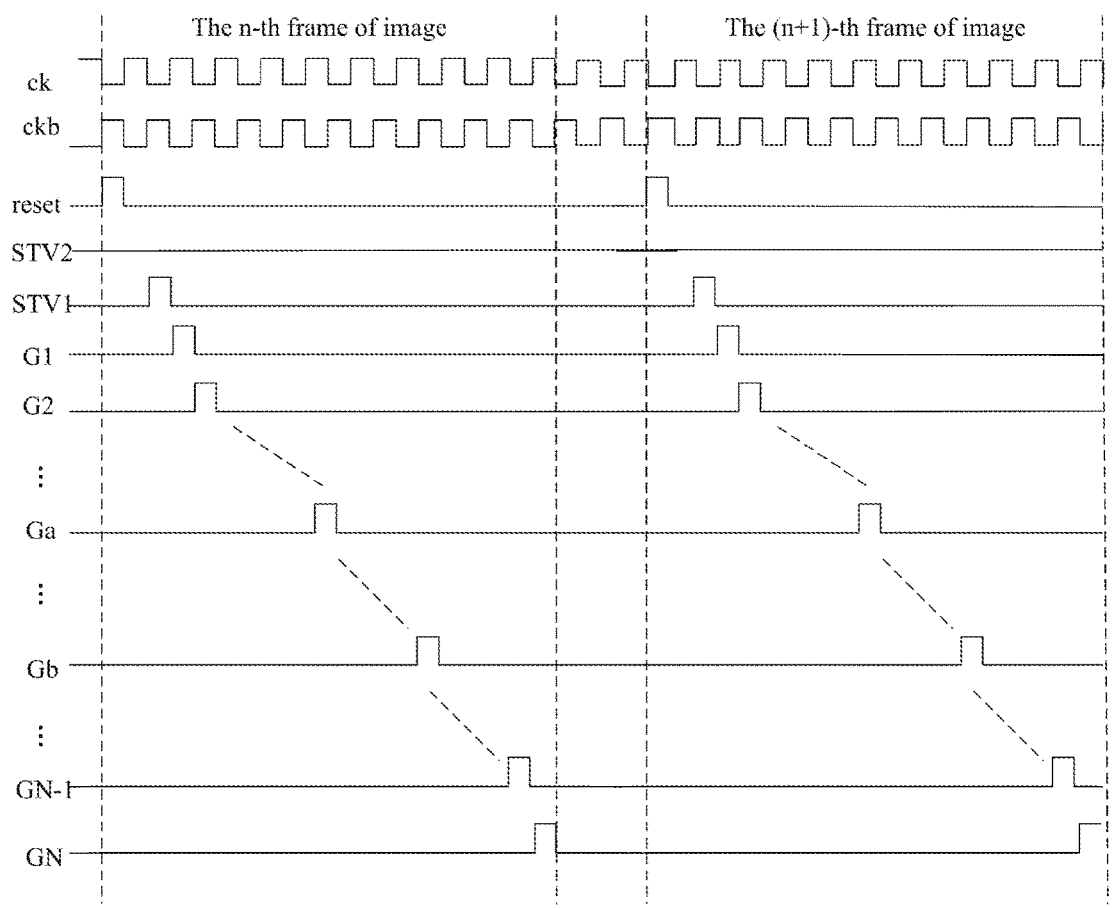
FIG. 9C is a timing diagram of a gate driver circuit of a display panel in a first operating mode according to an embodiment of the invention.

In one implementation, in the display panel according to the embodiment of the invention, as illustrated in FIG. 9A to FIG. 9C, the timing controller, further transmits a reset signal Reset to the respective levels of shift registers in the gate driver circuit for a next image frame after a period of time elapses after the last level of shift register outputs s scan signal for the current image frame. That is, there is a porch period of time preset between the two frames of images so that a sufficient period of time can be reserved for processing data in the next image frame.

In one implementation, in the display panel according to the embodiment of the invention, the timing controller is further configured to control the gate driver circuit upon reception of the first mode control signal to output a scan signal to the N rows of gate lines on the display panel sequentially at a first refresh frequency.

To control the gate driver circuit upon reception of the second mode control signal to output a scan signal to the m adjacent rows of gate lines on the display screen sequentially at a second refresh frequency, where the second refresh frequency is smaller than or equal to the first refresh frequency. If the second refresh frequency is set smaller than the first refresh frequency, then power consumption of the display panel in the second operating mode may be further lowered, and if the second refresh frequency is set equal to the first refresh frequency, then the refresh frequency of the existing display panel may not be altered, thus making it easier to operate the display panel.

Figure 10A:
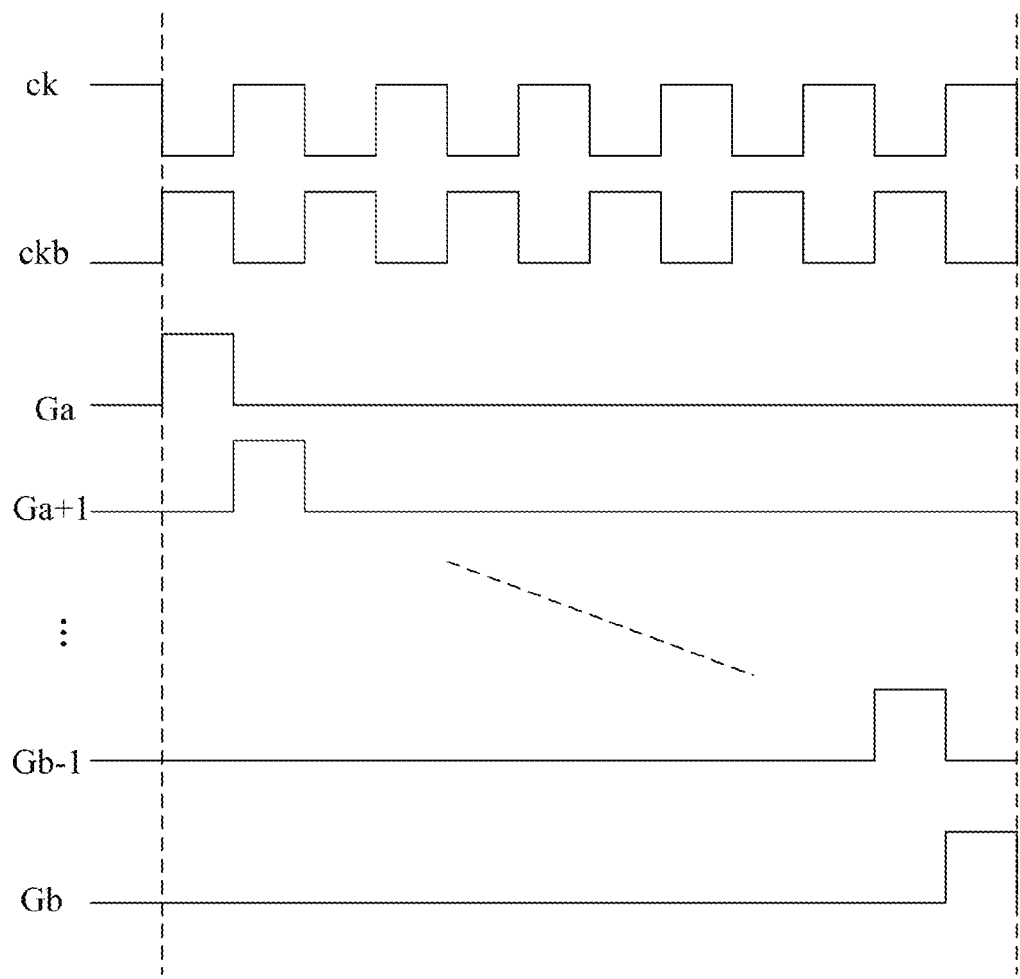
FIG. 10A is a timing diagram of a refresh frequency of a display panel according to an embodiment of the invention.
Figure 10B:
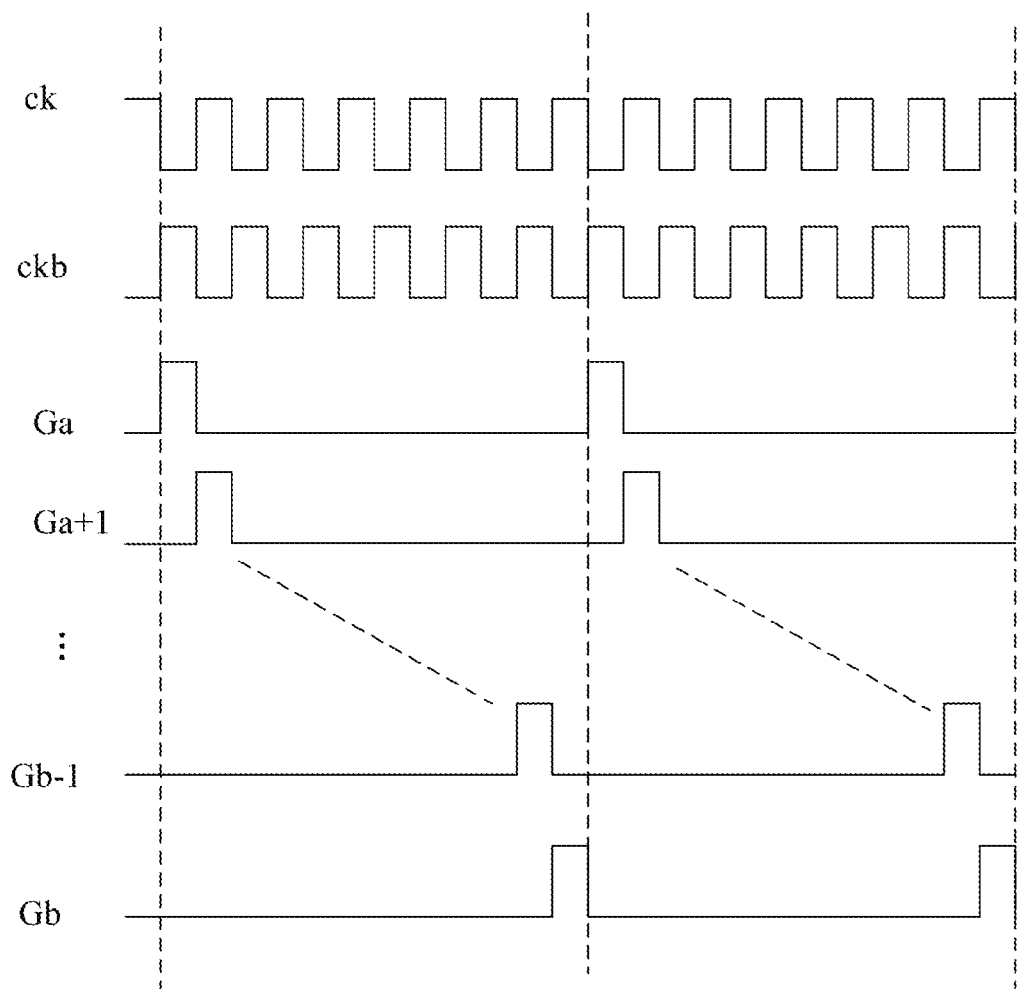
FIG. 10B is another timing diagram of a refresh frequency of a display panel according to an embodiment of the invention.

In one implementation, in the display panel according to the embodiment of the invention, the timing controller controls the refresh frequency of the gate driver circuit by controlling the clock signal transmitted to the gate driver circuit, and shorter a clock periodicity at which the clock signal is transmitted to the gate driver circuit by the timing controller is, higher the refresh frequency of the gate driver circuit is. As illustrated in FIG. 10A and FIG. 10B, as illustrated, the clock periodicity of the clock signals ck and ckb in FIG. 10A are twice the clock periodicity of the clock signals ck and ckb in FIG. 10B, and given the same number of rows to be scanned, a period of time for scanning one image frame in FIG. 10A is twice a period of time for scanning one image frame in FIG. 10B, that is, the refresh frequency in FIG. 10B is twice the refresh frequency in FIG. 10A.

In one implementation, the display panel according to the embodiment of the invention may be a liquid crystal display panel or an organic light-emitting display panel, although the embodiment of the invention may not be limited thereto.

Figure 11:
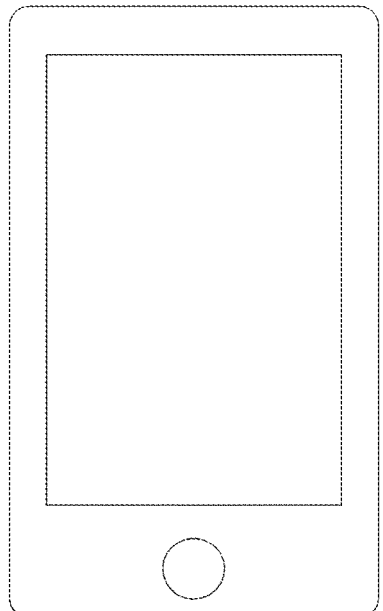
FIG. 11 is a schematic structural diagram of a display device according to an embodiment of the invention.

Based upon the same inventive idea, an embodiment of the invention further provides a display device as illustrated in FIG. 11, where the display device includes the display panel according to any one of the embodiments above according to the invention. The display device can be a mobile phone, a tablet computer, a TV set, a display, a notebook computer, a digital photo frame, a navigator, and any other product or component capable of displaying. Since the display device addresses the problem under a similar principle to that of the display panel as described above, reference can be made to the embodiments of the display panel above for an implementation of the display device, so a repeated description thereof may be omitted here.

Figure 12:
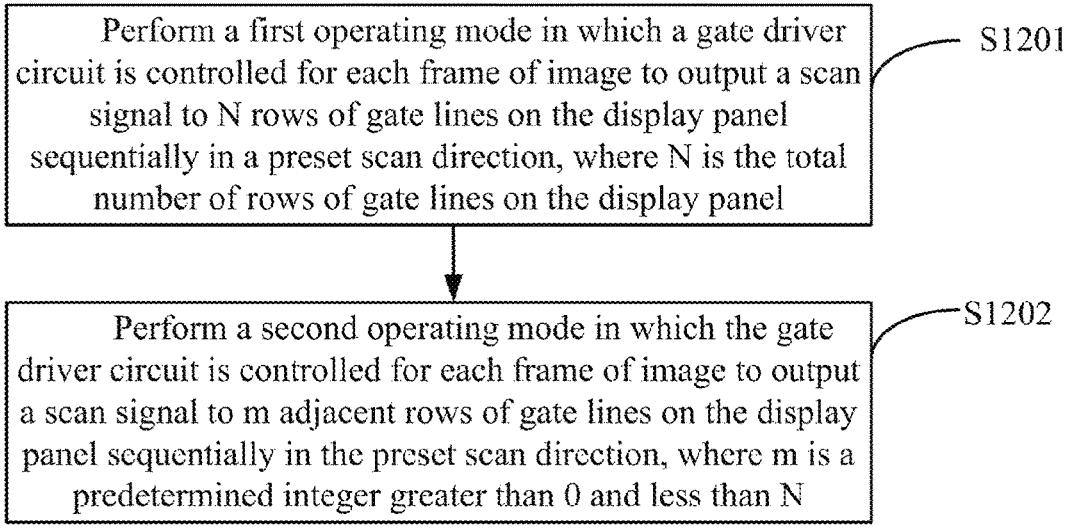
FIG. 12 is a flow chart of a method for driving a display device according to an embodiment of the invention.

Based upon the same inventive idea, an embodiment of the invention further provides a method for driving a display panel as illustrated in FIG. 12.

Where the method includes the following steps: S1201 is to perform a first operating mode in which a gate driver circuit is controlled for each image frame to output a scan signal to N rows of gate lines on the display panel sequentially in a preset scan direction, where N is the total number of rows of gate lines on the display panel.

S1202 is to perform a second operating mode in which the gate driver circuit is controlled for each image frame to output a scan signal to m adjacent rows of gate lines on the display panel sequentially in the preset scan direction, where m is a predetermined integer greater than 0 and less than N.

In the driving method according to the embodiment of the invention, in the first operating mode, the gate driver circuit is controlled for each image frame to output a scan signal to N rows of gate lines on the display panel sequentially in the preset scan direction to thereby display throughout the screen; and in the second operating mode, the gate driver circuit is controlled for each image frame to output a scan signal to m adjacent rows of gate lines on the display panel sequentially in the preset scan direction to thereby display only in an area corresponding to the m adjacent rows of gate lines without scanning the gate lines in an area in which no image may be displayed, i.e., the other gate lines than the m adjacent rows of gate lines, so as to lower power consumption of the display panel operating in the second operating mode.

In one implementation, in the driving method according to the embodiment of the invention, the gate driver circuit includes N levels of shift registers, which are concatenated, where each level of shift register corresponds to one row of gate lines on the display panel, and the a-th level of shift register to the b-th level of shift register correspond to the m adjacent rows of gate lines on the display panel.

The driving method includes: Performing the first operating mode in which a frame trigger signal is transmitted to the first level of shift register in the gate driver circuit for each image frame to trigger the N levels of shift registers to output a scan signal sequentially; and Performing the second operating mode in which a frame trigger signal is transmitted to the a-th level of shift register in the gate driver circuit for each image frame to trigger the a-th level of shift register to the b-th level of shift register to output a scan signal sequentially.

In one implementation, in the driving method according to the embodiment of the invention, after the frame trigger signal is transmitted to the a-th level of shift register, and the b-th level of shift register outputs the scan signal, the method further includes: transmitting a reset signal to the (b+1)-th level of shift register. In this way, the (b+1)-th level of shift register can be structured the same as the shift register in the existing gate driver circuit without necessary of structurally modifying the (b+1)-th level of shift register.

Furthermore in one implementation, in the driving method according to the embodiment of the invention, at the same time when the reset signal is transmitted to the (b+1)-th level of shift register, the method further includes: transmitting the reset signal to the other levels of shift registers. Since the reset terminal of each level of shift registers in the existing gate driver circuit is connected with the same reset signal line, in order to transmit the reset signal to the (b+1)-th level of shift register without changing the connection relationship in the gate driver circuit, the reset signal may be transmitted to each level of shift registers.

Alternatively in one implementation, in the driving method according to the embodiment of the invention, after the frame trigger signal is transmitted to the a-th level of shift register, and the b-th level of shift register outputs the scan signal, the method further includes: converting a clock signal transmitted to the gate driver circuit into a direct-current signal, where only the clock signal is converted into a direct-current signal without changing the connection relationship in the gate driver circuit.

In one implementation, in the driving method according to the embodiment of the invention, before the frame trigger signal is output to the gate driver circuit for each image frame, the method further includes: transmitting a reset signal to the respective levels of shift registers. That is, before each image frame is scanned, data in the gate driver circuit are firstly cleared, that is, charges remaining in the gate driver circuit for a previous image frame are cleared.

In one implementation, in the driving method according to the embodiment of the invention, in the first operating mode, the gate driver circuit is controlled to output a scan signal to the N rows of gate lines on the display panel sequentially at a first refresh frequency.

In the second operating mode, the gate driver circuit is controlled to output a scan signal to the m adjacent rows of gate lines on the display screen sequentially at a second refresh frequency, where the second refresh frequency is smaller than or equal to the first refresh frequency. If the second refresh frequency is set smaller than the first refresh frequency, then power consumption of the display panel in the second operating mode may be further lowered, and if the second refresh frequency is set equal to the first refresh frequency, then the refresh frequency of the existing display panel may not be altered, thus making it easier to operate the display panel.

In one implementation, in the driving method according to the embodiment of the invention, the refresh frequency of the gate driver circuit is controlled by controlling the clock signal transmitted to the gate driver circuit, and shorter a clock periodicity at which the clock signal is transmitted to the gate driver circuit by the timing controller is, higher the refresh frequency of the gate driver circuit is.

In the method for driving a display panel, the display panel, and the display device according to the embodiment of the invention, in the first operating mode, the gate driver circuit is controlled for each image frame to output a scan signal to N rows of gate lines on the display panel sequentially in the preset scan direction to thereby display throughout the screen; and in the second operating mode, the gate driver circuit is controlled for each image frame to output a scan signal to m adjacent rows of gate lines on the display panel sequentially in the preset scan direction to thereby display only in an area corresponding to the m adjacent rows of gate lines without scanning the gate lines in an area in which no image may be displayed, i.e., the other gate lines than the m adjacent rows of gate lines, so as to lower power consumption of the display panel operating in the second operating mode.

Evidently those skilled in the art can make various modifications and variations to the invention without departing from the spirit and scope of the invention. Accordingly the invention is also intended to encompass these modifications and variations thereto so long as the modifications and variations come into the scope of the claims appended to the invention and their equivalents.

The invention claimed is:
1. A display panel, comprising:
a gate driver circuit;
a timing controller;
a mode switching circuit;
N rows of gate lines, wherein N is the total number of rows of gate lines on the display panel;
the gate driver circuit is connected with the N rows of gate lines, and configured to be controlled by the timing controller to output a scan signal to the gate lines;
the mode switching circuit is configured to transmit a first mode control signal to the timing controller in a first operating mode, and a second mode control signal to the timing controller in a second operating mode;
the timing controller is configured to control the gate driver circuit for each image frame to sequentially output a scan signal to the N rows of gate lines on the display panel in a preset scan direction upon reception of the first mode control signal; and to control the gate driver circuit for each image frame to sequentially output a scan signal to m adjacent rows of gate lines on the display panel in the preset scan direction upon reception of the second mode control signal, wherein m is a predetermined integer greater than 0 and less than N; and
wherein the gate driver circuit comprises concatenated N levels of shift registers, an output terminal of each level of the shift registers other than first level of shift register is connected with an end terminal of a preceding level of shift register, and the output terminal of each level of the shift registers other than last level of shift register is connected with an input terminal of a succeeding level of shift register; and
the display panel further comprises a first trigger signal line connected between the first level of shift register and the timing controller and a second trigger signal line connected between the a-th level of shift register and the timing controller.

2. The display panel according to claim 1, wherein each level of the shift registers corresponds to one row of gate lines on the display panel and the a-th level of shift register to the b-th level of shift register correspond to the m adjacent rows of gate lines on the display panel; and
the timing controller is configured to transmit a frame trigger signal to the first level of shift register in the gate driver circuit for each image frame to trigger the N levels of the shift registers to output a scan signal sequentially, upon reception of the first mode control signal; and transmit a frame trigger signal to the a-th level of shift register in the gate driver circuit for each image frame to trigger the a-th level of shift register to the b-th level of shift register to output a scan signal sequentially, upon reception of the second mode control signal.

3. The display panel according to claim 2, wherein the timing controller transmits the frame trigger signal to the first level of shift register over the first trigger signal line connected between the first level of shift register and the timing controller; and the timing controller transmits the frame trigger signal to the a-th level of shift register over the second trigger signal line connected between the a-th level of shift register and the timing controller.

4. The display panel according to claim 2, wherein the timing controller is further configured:

after the frame trigger signal is transmitted to the a-th level of shift register, and the b-th level of shift register outputs the scan signal, to transmit a reset signal to the (b+1)-th level of shift register.

5. The display panel according to claim 4, wherein the timing controller is further configured to transmit the reset signal to other levels of shift registers at the same time when the reset signal is transmitted to the (b+1)-th level of shift register.

6. The display panel according to claim 2, wherein the timing controller is further configured:

after the frame trigger signal is transmitted to the a-th level of shift register, and the b-th level of shift register outputs the scan signal, to convert a clock signal transmitted to the gate driver circuit into a direct-current signal.

7. The display panel according to claim 2, wherein the timing controller is further configured:

after the first mode control signal or the second mode control signal is received, and before the frame trigger signal is transmitted to the gate driver circuit for each image frame, to transmit a reset signal to each level of the shift registers.

8. The display panel according to claim 1, wherein the timing controller is further configured to:

control the gate driver circuit upon reception of the first mode control signal to sequentially output a scan signal to the N rows of gate lines on the display panel at a first refresh frequency; and control the gate driver circuit upon reception of the second mode control signal to sequentially output a scan signal to the m adjacent rows of gate lines on the display screen at a second refresh frequency, wherein the second refresh frequency is smaller than or equal to the first refresh frequency.

9. The display panel according to claim 8, wherein the timing controller controls a refresh frequency of the gate driver circuit by controlling a clock signal transmitted to the gate driver circuit, and shorter a clock periodicity at which the clock signal is transmitted to the gate driver circuit by the timing controller is, higher the refresh frequency of the gate driver circuit is.

10. The display panel according to claim 2, wherein in the gate driver circuit, a reset terminal of each level of the shift registers is connected with the same reset signal line.

11. A display device, comprising:
a display panel;
a gate driver circuit;
a timing controller;
a mode switching circuit;
N rows of gate lines, wherein N is the total number of rows of gate lines on the display panel;
the gate driver circuit is connected with the N rows of gate lines, and configured to be controlled by the timing controller to output a scan signal to the gate lines;
the mode switching circuit is configured to transmit a first mode control signal to the timing controller in a first operating mode, and a second mode control signal to the timing controller in a second operating mode;

the timing controller is configured to control the gate driver circuit for each image frame to sequentially output a scan signal to the N rows of gate lines on the display panel in a preset scan direction upon reception of the first mode control signal and control the gate driver circuit for each image frame to sequentially output a scan signal to m adjacent rows of gate lines on the display panel in the preset scan direction upon reception of the second mode control signal, wherein m is a predetermined integer greater than 0 and less than N; and wherein the gate driver circuit comprises concatenated N levels of shift registers, an output terminal of each level of the shift registers other than first level of shift register is connected with an end terminal of a preceding level of shift register, and the output terminal of each level of the shift registers other than last level of shift register is connected with an input terminal of a succeeding level of shift register; and the display panel further comprises a first trigger signal line connected between the first level of shift register and the timing controller and a second trigger signal line connected between the a-th level of shift register and the timing controller.

12. A method for driving a display panel, the method comprising:

performing a first operating mode in which a gate driver circuit is controlled for each image frame to sequentially output a scan signal to N rows of gate lines on the display panel in a preset scan direction, wherein N is the total number of rows of gate lines on the display panel;

performing a second operating mode in which the gate driver circuit is controlled for each image frame to sequentially output a scan signal to m adjacent rows of gate lines on the display panel in the preset scan direction, wherein m is a predetermined integer greater than 0 and less than N; and wherein the gate driver circuit comprises concatenated N levels of shift registers, an output terminal of each level of the shift registers other than first level of shift register is connected with an end terminal of a preceding level of shift register, and the output terminal of each level of the shift registers other than last level of shift register is connected with an input terminal of a succeeding level of shift register; and the display panel further comprises a timing controller, a first trigger signal line connected between the first level of shift register and the timing controller, and a second trigger signal line connected between the a-th level of shift register and the timing controller.

13. The driving method according to claim 12, wherein each level of the shift registers corresponds to one row of gate lines on the display panel and the a-th level of shift register to the b-th level of shift register correspond to the m adjacent rows of gate lines on the display panel; and the driving method comprises:

performing the first operating mode in which a frame trigger signal is transmitted to the first level of shift register in the gate driver circuit for each image frame to trigger the N levels of the shift registers to sequentially output a scan signal; and performing the second operating mode in which a frame trigger signal is transmitted to the a-th level of shift register in the gate driver circuit for each image frame to trigger the a-th level of shift register to the b-th level of shift register to sequentially output a scan signal.

14. The method according to claim 13, wherein after the frame trigger signal is transmitted to the a-th level of shift register, and the b-th level of shift register outputs the scan signal, the method further comprises:

transmitting a reset signal to (b+1)-th level of shift register.

15. The method according to claim 14, wherein at the same time when the reset signal is transmitted to the (b+1)-th level of shift register, the method further comprises:

transmitting the reset signal to other levels of shift registers.

16. The method according to claim 13, wherein after the frame trigger signal is transmitted to the a-th level of shift register, and the b-th level of shift register outputs the scan signal, the method further comprises:

converting a clock signal transmitted to the gate driver circuit into a direct-current signal.

17. The method according to claim 13, wherein before the frame trigger signal is output to the gate driver circuit for each image frame, the method further comprises:

transmitting a reset signal to each level of the shift registers.

18. The method according to 12, wherein in the first operating mode, the gate driver circuit is controlled to output a scan signal to the N rows of gate lines on the display panel sequentially at a first refresh frequency; and the gate driver circuit is controlled to sequentially output a scan signal to the m adjacent rows of gate lines on the display screen at a second refresh frequency, wherein the second refresh frequency is smaller than or equal to the first refresh frequency.

19. The method according to claim 18, wherein the refresh frequency of the gate driver circuit is controlled by controlling the clock signal transmitted to the gate driver circuit, and shorter a clock periodicity at which the clock signal is transmitted to the gate driver circuit by the timing controller is, higher the refresh frequency of the gate driver circuit is.

* * * * *